United States Patent
Rotondaro et al.

(10) Patent No.: US 7,422,969 B2
(45) Date of Patent: Sep. 9, 2008

(54) MULTI-STEP PROCESS FOR PATTERNING A METAL GATE ELECTRODE

(75) Inventors: Antonio L. P. Rotondaro, Dallas, TX (US); Deborah J. Riley, Richardson, TX (US); Trace Q. Hurd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/861,392

(22) Filed: Sep. 26, 2007

(65) Prior Publication Data

US 2008/0020558 A1    Jan. 24, 2008

Related U.S. Application Data

(63) Continuation of application No. 10/999,271, filed on Nov. 29, 2004, now Pat. No. 7,323,403.

(51) Int. Cl.
*H01L 21/3205* (2006.01)
*H01L 21/4763* (2006.01)

(52) U.S. Cl. .......... 438/585; 438/734; 257/E21.176; 257/E21.229

(58) Field of Classification Search .......... 438/585, 438/734; 257/E21.176, E21.229
See application file for complete search history.

(56) References Cited

U.S. PATENT DOCUMENTS

| | | | |
|---|---|---|---|
| 5,625,217 | A | 4/1997 | Chau et al. |
| 5,789,312 | A | 8/1998 | Buchanan et al. |
| 5,891,784 | A | 4/1999 | Cheung et al. |
| 5,948,702 | A | 9/1999 | Rotondaro |
| 6,100,188 | A | 8/2000 | Lu et al. |
| 6,261,934 | B1 | 7/2001 | Kraft et al. |
| 6,432,779 | B1 | 8/2002 | Hobbs et al. |
| 6,818,488 | B2 | 11/2004 | Joubert et al. |
| 6,833,596 | B2 | 12/2004 | Matsuo |
| 6,893,927 | B1 | 5/2005 | Shah et al. |
| 2004/0113171 | A1 | 6/2004 | Chiu et al. |

OTHER PUBLICATIONS

Stanley Wolf, Silicon Processing for the VLSI Era, 1986, Lattice Press, vol. II, pp. 439-441.

*Primary Examiner*—Scott B. Geyer
*Assistant Examiner*—Stanetta D Isaac
(74) *Attorney, Agent, or Firm*—Jacqueline J. Garner; W. James Brady, III; Frederick J. Telecky, Jr.

(57) ABSTRACT

The present invention provides a method for patterning a metal gate electrode and a method for manufacturing an integrated circuit including the same. The method for patterning the metal gate electrode, among other steps, includes forming a metal gate electrode layer (220) over a gate dielectric layer (210) located on a substrate (110), and patterning the gate electrode layer (220) using a combination of a dry etch process (410) and a wet etch process (510).

8 Claims, 5 Drawing Sheets

MULTI-STEP PROCESS FOR PATTERNING A METAL GATE ELECTRODE

This is a continuation application of Ser. No. 10/999,271 filed Nov. 29, 2004 now U.S. Pat. No. 7,323,403.

TECHNICAL FIELD OF THE INVENTION

The present invention is directed, in general, to a process for patterning a metal gate electrode and, more specifically, to a multi-step process, including both dry and wet etches, for patterning a metal gate electrode.

BACKGROUND OF THE INVENTION

The fabrication of advanced sub-tenth-micron devices will require replacement of the highly doped polysilicon gate electrode by new gate materials. The gate electrode stack for advanced devices should provide low sheet resistance to minimize interconnect delays, have a tunable work function to enable both n and p-type transistors to operate in surface channel mode, and prevent gate electrode depletion effects (to assure that the effective oxide thickness is equal to the physical oxide thickness).

For this, as well as other reasons, metal gate electrode stacks have been proposed for these sub-tenth-micron devices. Unfortunately, however, the conventional single-step patterning of the metal gate electrode stacks for these short gate length (e.g., sub-tenth-micron) transistors, which are often formed on ultra-thin (e.g., sub 5 nm) gate oxides, imposes a severe challenge to the etch process. Very high selectivity to $SiO_2$ has to be achieved to avoid oxide punch-through and subsequent damage to the silicon in the source and drain regions. Even when successfully stopped in the gate oxide, the conventional gate etch process introduces corner damage to the gate structure that needs to be annealed to guarantee good gate oxide integrity (GOI) properties of the transistor. However, it is difficult to anneal the corner damage on metal gate structures, since many metals readily oxidize in conventional oxidation processes.

Accordingly, what is needed in the art is a method for patterning metal gate structures of transistor devices that do not experience the drawbacks, particularly gate oxide punch-through, as experienced by the prior art methods.

SUMMARY OF THE INVENTION

To address the above-discussed deficiencies of the prior art, the present invention provides a method for patterning a metal gate electrode and a method for manufacturing an integrated circuit including the same. The method for patterning the metal gate electrode, among other steps, includes forming a metal gate electrode layer over a gate dielectric layer located on a substrate, and patterning the gate electrode layer using a combination of a dry etch process and a wet etch process.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the acknowledgement that the gate patterning processes currently used are insufficient to provide a good electrode profile for next generation short gate length metal gate electrodes, and particularly those located on ultra-thin gate dielectrics. Based on this acknowledgement, the present invention recognized that if the gate patterning process could be tailored to a multi-step patterning process using both a dry etch process and a wet etch process, the electrode profile problems acknowledged in the metal gate electrodes could be substantially reduced, if not eliminated.

Using both the dry etch process and wet etch process according to the unique aspects of the present invention provides a number of advantages. First and foremost, the multi-step process allows the metal gate electrode to be accurately patterned resulting in a good electrode profile. Additionally, the multi-step process enables the definition of small gate length metal electrodes with tunable undercut. Accordingly, the realization of controlled notched gate electrodes becomes trivial with the proposed invention. Additionally, the proposed invention solves the challenge of stopping the etch of the metal gate electrode on ultra-thin gate dielectrics. This, as those skilled in the art would expect, substantially prevent punchthrough and thus increases the reliability of the gate dielectrics. Also, the multi-step process substantially eliminates the moat recess that is a consequence of the traditionally dry etch process used to define the metal gate electrode. In essence, by stopping the traditional dry etch away from the gate dielectric it is almost guaranteed that the moat recess is eliminated.

Figure 1:
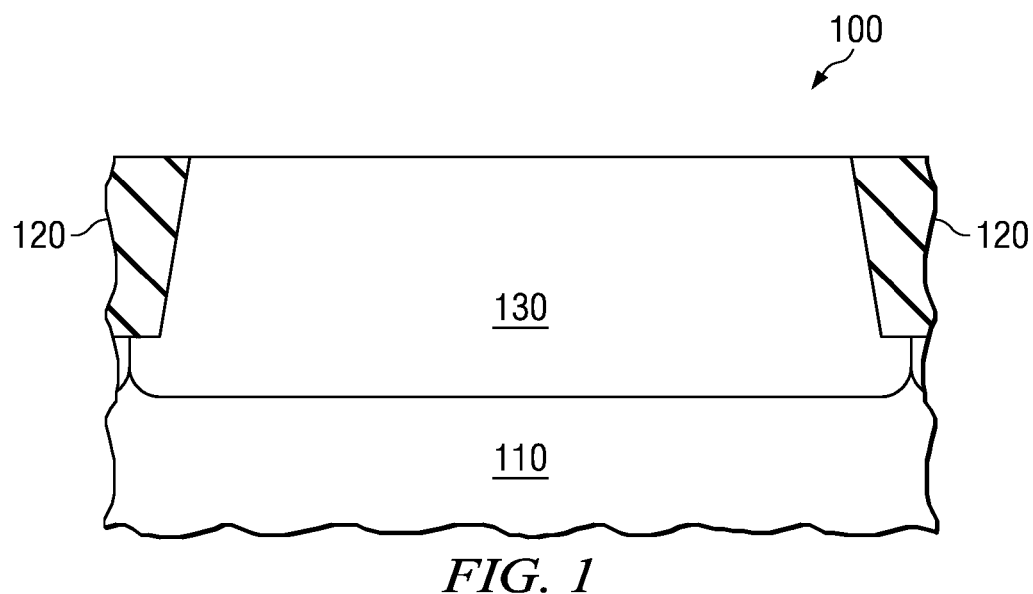
FIG. 1 illustrates a cross-sectional view of a partially completed semiconductor device manufactured in accordance with the principles of the present invention.

Turning now to FIGS. 1-6, illustrated are cross-sectional views of detailed manufacturing steps instructing how one might, in an advantageous embodiment, manufacture a semiconductor device in accordance with the principles of the present invention. FIG. 1 illustrates a cross-sectional view of a partially completed semiconductor device 100 manufactured in accordance with the principles of the present invention. The partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer). In the embodiment illustrated in FIG. 1, the substrate 110 is a P-type substrate; however, one skilled in the art understands that the substrate 110 could be an N-type substrate without departing from the scope of the present invention. In such a case, each of the dopant types described throughout the remainder of this document would be reversed. For clarity, no further reference to this opposite scheme will be discussed.

Located within the substrate 110 in the embodiment shown in FIG. 1 are shallow trench isolation regions 120. The shallow trench isolation regions 120 isolate the semiconductor device 100 from other devices located proximate thereto. As those skilled in the art understand the various steps used to form these conventional shallow trench isolation regions 120, no further detail will be given. While shallow trench isolation regions 120 are shown, as well as discussed, those skilled in the art understand that other types of isolation structures, such as LOCOS isolation structures, could be used.

In the illustrative embodiment of FIG. 1, also formed within the substrate 110 is a well region 130. The well region 130, in light of the P-type semiconductor substrate 110, would more than likely contain an N-type dopant. For example, the well region 130 would likely be doped with an N-type dopant dose ranging from about 1E13 atoms/cm$^2$ to about 1E14 atoms/cm$^2$ and at a energy ranging from about 100 keV to about 500 keV. This results in the well region 130 having a peak dopant concentration ranging from about 5E17 atoms/cm$^3$ to about 1E19 atoms/cm$^3$. While details have been given for the substrate 110, isolation regions 120, and well region 130, those skilled in the art understand that the specifics of each of those features are not germane to the present invention.

Figure 2A:
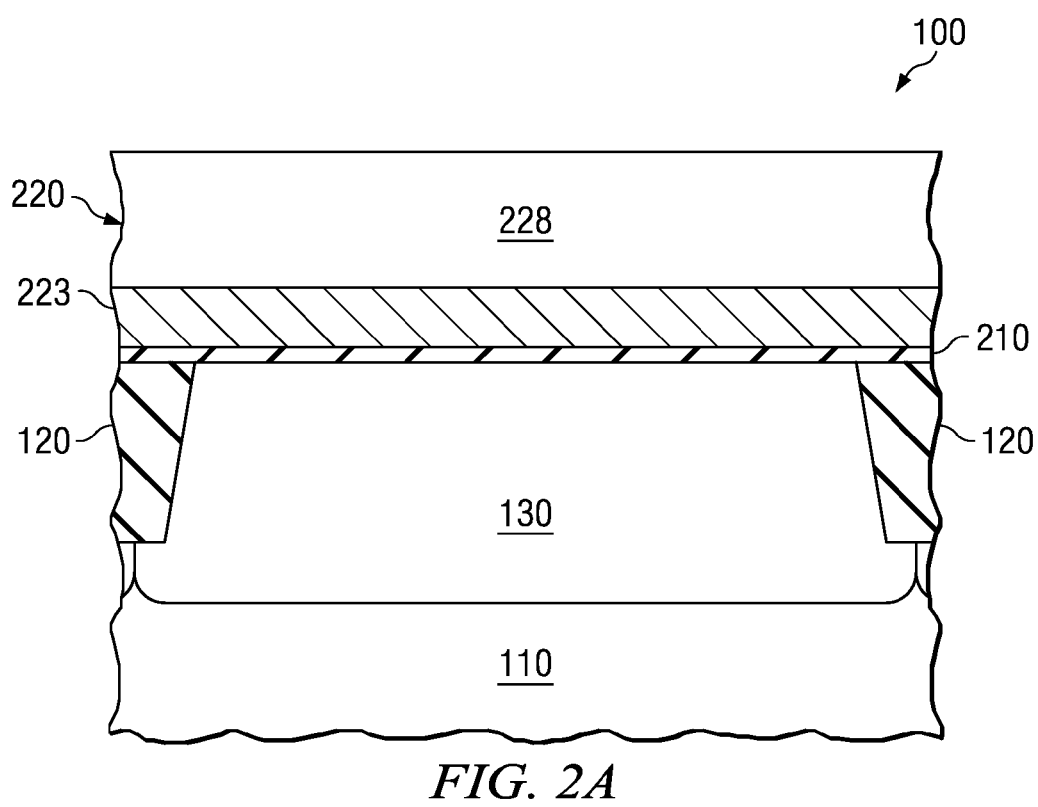
FIG. 2A illustrates a cross-sectional view of the partially completed semiconductor device illustrated in FIG. 1 after forming a blanket layer of gate dielectric material over the substrate and forming a blanket layer of metal gate electrode material over the blanket layer of gate dielectric material.

Turning now to FIG. 2A, illustrated is a cross-sectional view of the partially completed semiconductor device 100 illustrated in FIG. 1 after forming a blanket layer of gate dielectric material 210 over the substrate 110 and forming a blanket layer of metal gate electrode material 220 over the blanket layer of gate dielectric material 210. The blanket layer of gate dielectric material 210 may comprise a number of different materials and stay within the scope of the present invention. For example, the blanket layer of gate dielectric material 210 may comprise silicon dioxide, or in an alternative embodiment comprise a high dielectric constant (k) material. In the illustrative embodiment of FIG. 2A, however, the blanket layer of gate dielectric material 210 is a silicon dioxide layer having an ultra-thin thickness. For example, the blanket layer of gate dielectric material 210 will often have a thickness of about 5 nm or less, and more particularly a thickness ranging from about 0.5 nm to about 3 nm. Nevertheless, any conceivable blanket layer of gate dielectric material 210 thickness could be used.

Any one of a plurality of manufacturing techniques could be used to form the blanket layer of gate dielectric material 210. For example, the blanket layer of gate dielectric material 210 maybe either grown or deposited. Additionally, the growth or deposition steps may require a significant number of different temperatures, pressures, gasses, flow rates, etc. Furthermore, the blanket layer of gate dielectric material 210 might receive a nitridation treatment to convert it partially or entirely to a silicon oxynitride layer.

The blanket layer of metal gate electrode material 220 illustrated in FIG. 2A includes two different layers. For instance, the blanket layer of metal gate electrode material 220 includes a first metal layer 223 and a second polysilicon layer 228, in the embodiment shown. As will be understood fully below, the inclusion of the two different layers, almost independent of their material composition, adds to the manufacturability of the semiconductor device 100. Accordingly, as long as layer closest to the blanket layer of gate dielectric material 210 includes a metal, just about any conceivable combination of materials could be used. Thus, embodiments exist where the first layer 223 comprises a metal and the second layer 228 also comprises a metal, preferably a different metal.

In the illustrative embodiment of FIG. 2A, however, the first metal layer 223 comprises titanium nitride and the second polysilicon layer 228 comprises standard polysilicon. It goes without saying that the first metal layer 223 could comprise a host of different metals, including WN, TaN, Mo, RuO$_2$, NiSi, TiB$_2$, etc., as well as the second polysilicon layer 228 could comprise another type of polysilicon, such as amorphous polysilicon, without departing from the scope of the present invention.

The deposition conditions for the blanket layer of metal gate electrode material 220 may vary, however, if the first metal layer 223 were to comprise titanium nitride, the first metal layer 223 could be deposited by reactive sputtering using a pressure ranging from about 1 mtorr to about 100 mtorr and room temperature in the presence of a titanium target. If the second polysilicon layer 228 were to comprise standard polysilicon, such as the instance in FIG. 2A, the blanket layer of polysilicon material could be deposited using a pressure ranging from about 100 torr to about 300 torr, a temperature ranging from about 620° C. to about 700° C., and a SiH$_4$ gas flow ranging from about 50 sccm to about 150 sccm. If, however, amorphous polysilicon were desired, the blanket layer of polysilicon material could be deposited using a pressure ranging from about 100 torr to about 300 torr, a temperature ranging from about 450° C. to about 550° C., and a SiH$_4$ gas flow ranging from about 100 sccm to about 300 sccm.

The desired thickness of the blanket layer of metal gate electrode material 220 will obviously depend on the scaling of the semiconductor device 100. Nevertheless, the embodiment of the present invention has the thickness of the blanket layer of metal gate electrode material 220 being between about 60 nm and about 150 nm, and preferably about 90 nm. Of that, the first metal layer 223 comprises about 10 percent and the second polysilicon layer 228 comprises about 90 percent. As those skilled in the art would appreciate, other thicknesses are within the scope of the present invention.

Figure 2B:
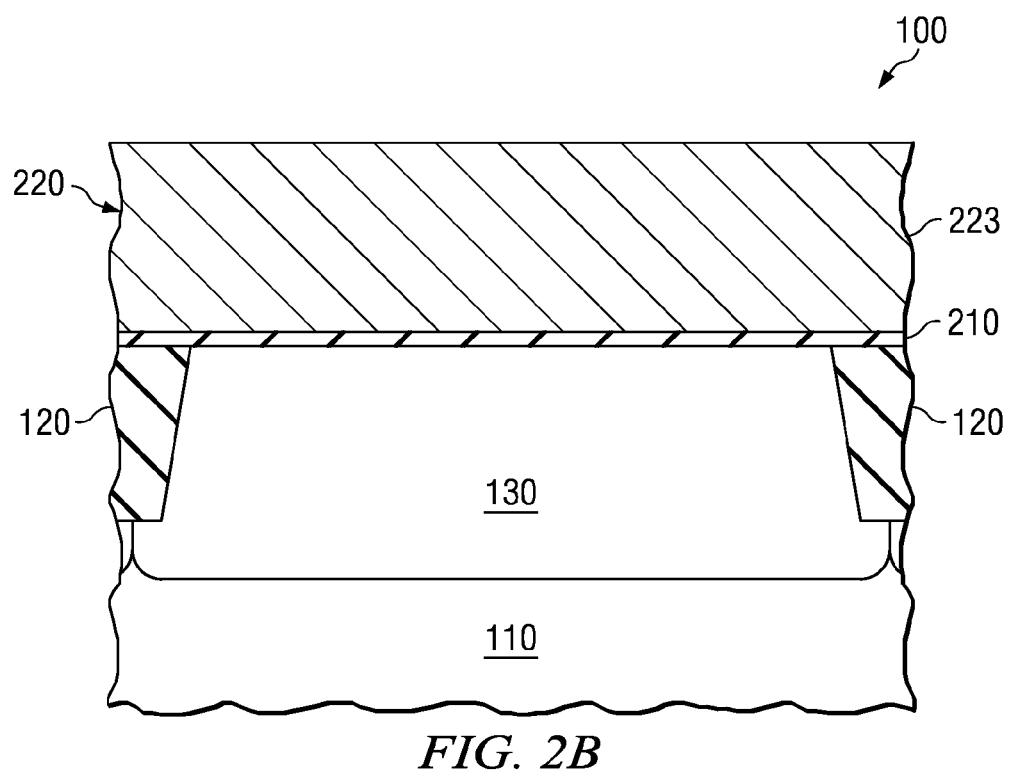
FIG. 2B illustrates an alternative embodiment of the invention where the blanket layer of metal gate electrode material comprises only a single material layer.

Turning briefly to FIG. 2B, illustrated is an alternative embodiment of the invention where the blanket layer of metal gate electrode material 220 comprises only a single metal layer 223. The embodiment of FIG. 2B would have many of the same properties as the embodiment of FIG. 2A, except this embodiment does not includes a multi-layer blanket layer of metal gate electrode material 220. While the embodiment of FIG. 2B might not provide the ease of manufacture as that of FIG. 2A, its use is nevertheless conceivable.

Figure 3:
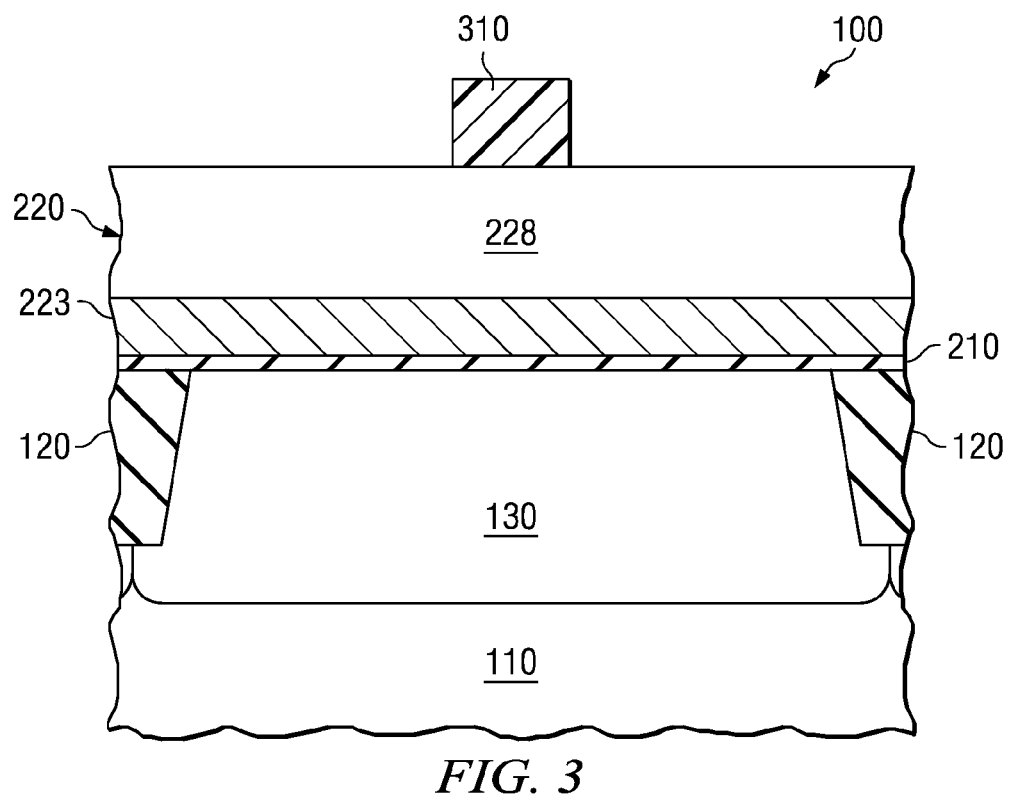
FIG. 3 illustrates a cross-sectional view of the partially completed semiconductor device illustrated in FIG. 2A after patterning a photoresist layer thereon.

Turning now to FIG. 3, illustrated is a cross-sectional view of the partially completed semiconductor device 100 illustrated in FIG. 2A after patterning a photoresist layer 310 thereon. As the photoresist layer 310 is conventionally formed, the details of the process are not described herein for brevity.

Figure 4:
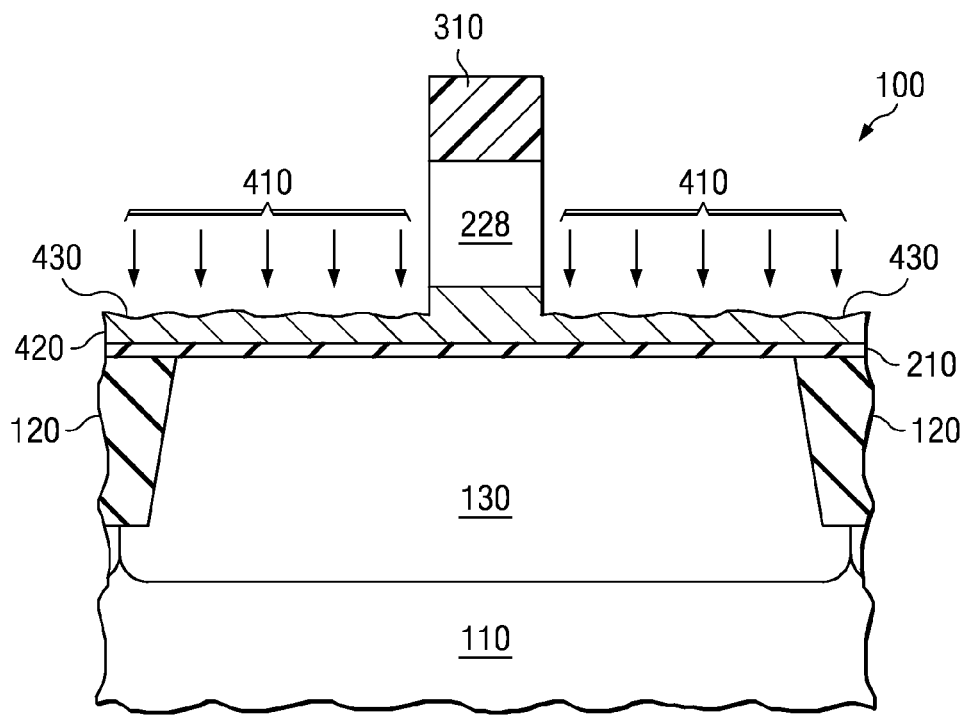
FIG. 4 illustrates a cross-sectional view of the partially completed semiconductor device illustrated in FIG. 3 after subjecting the blanket layer of metal gate electrode material to a first etch process.

Turning now to FIG. 4, illustrated is a cross-sectional view of the partially completed semiconductor device 100 illustrated in FIG. 3 after subjecting the blanket layer of metal gate electrode material 220 to a first etch process. In the illustrative embodiment shown, the blanket layer of metal gate electrode material 220 is being subjected to a first dry etch process 410. In an advantageous embodiment, the first dry etch process 410 is an anisotropic etch process, possibly a biased plasma etch process, that is configured to etch into the first metal layer 223 as close to the blanket layer of gate dielectric material 210 as possible.

As shown in the illustrative embodiment of FIG. 4, the first dry etch process 410 etches into the blanket layer of metal gate electrode material 220 and stops before reaching the blanket layer of gate dielectric material 210, leaving a remaining gate electrode layer 420. In an exemplary embodiment, the thickness of the remaining gate electrode layer 420 should be as small as possible without etching any portion of the blanket layer of gate dielectric material 210. Nevertheless, it is far more important not to etch any portion of the blanket layer of gate dielectric material 210 than etch extremely close thereto.

As further shown in the embodiment of FIG. 4, the first dry etch process 410 often tends to modify the surface of the remaining gate electrode layer 420. The modification tends to show up as a modified, or roughened, surface 430. As will be discussed further below, this modified surface 430 is highly beneficial to the second wet etch step 510 (FIG. 5) that will follow.

The first dry etch process 410 is obviously highly dependent on the materials and thickness of the blanket layer of metal gate electrode material 220. Nevertheless, for the embodiment of FIGS. 1-6, the first dry etch process could be a biased plasma etch in a mixture of HBr:Cl:$O_2$ at a pressure between about 3 mtorr and about 6 mtorr at room temperature and a duration of about 30 seconds. As one would expect, other mixtures, pressures, temperatures and times could also be used.

Figure 5:
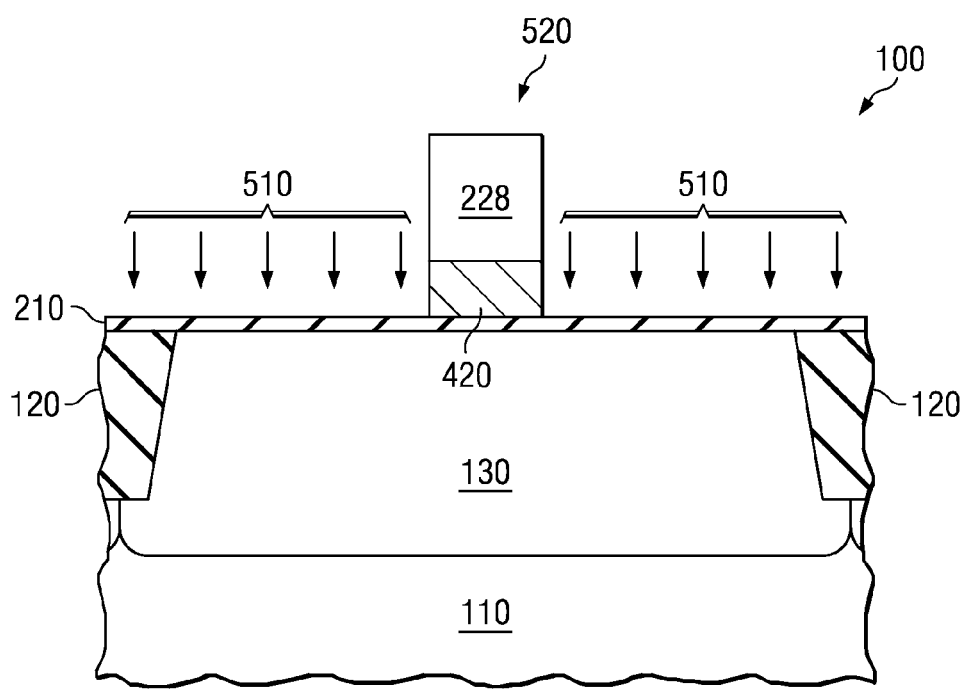
FIG. 5 illustrates a cross-sectional view of the partially completed semiconductor device illustrated in FIG. 4 after subjecting the remaining gate electrode layer to a second wet etch process, and removal of the photoresist layer.

Turning now to FIG. 5, illustrated is a cross-sectional view of the partially completed semiconductor device 100 illustrated in FIG. 4 after subjecting the remaining gate electrode layer 420 to a second wet etch process 510, and removal of the photoresist layer 310. The photoresist layer 310 can be removed by dry or wet methods. Preferably a wet photoresist strip is used in an ozonated DI-water solution at room temperature for a time between 300 seconds and 600 seconds. The second wet etch process 510 (e.g., a wet isotropic etch process), in contrast to the first dry etch process 410, has a high selectivity to the blanket layer of gate dielectric material 210. Accordingly, the wet etch process 510 is easily capable of removing the entire remaining gate electrode layer 420 without substantially affecting the blanket layer of gate dielectric material 210. Having achieved that, the blanket layer of gate dielectric material 510 does not experience the drawbacks, particularly the reliability issues, of the prior art gate dielectrics.

As with the dry etch process 410 disclosed above, the wet etch process 510 shown and described with respect to FIG. 5 may vary greatly while staying within the scope of the present invention. Specifically, the wet etch process 510 chemistry and time of exposure may vary greatly. For example, depending on the thickness and material composition of the remaining gate electrode layer 420, a dilute mixture of ammonium hydroxide, hydrogen peroxide and water, which is often called a SC1 wet etch, at a temperature ranging from about 25° C. to about 65° C. for a time period ranging from about 30 seconds to about 300 seconds, could be used to remove the remaining gate electrode layer 420. In another embodiment, a 30% hydrogen peroxide solution at a temperature of 55° C. can be used for a time period between 15 seconds and 60 seconds to remove the remaining gate electrode 420. Advantageous to the present invention, the modified surface 430 causes the remaining gate electrode layer 420 located in the exposed regions to etch much faster than the remaining gate electrode layer 420 defined by the completed gate structure 520. Accordingly, minimum erosion occurs in the second material layer 228 and minimum undercut occurs in the first material layer 223.

Figure 6:
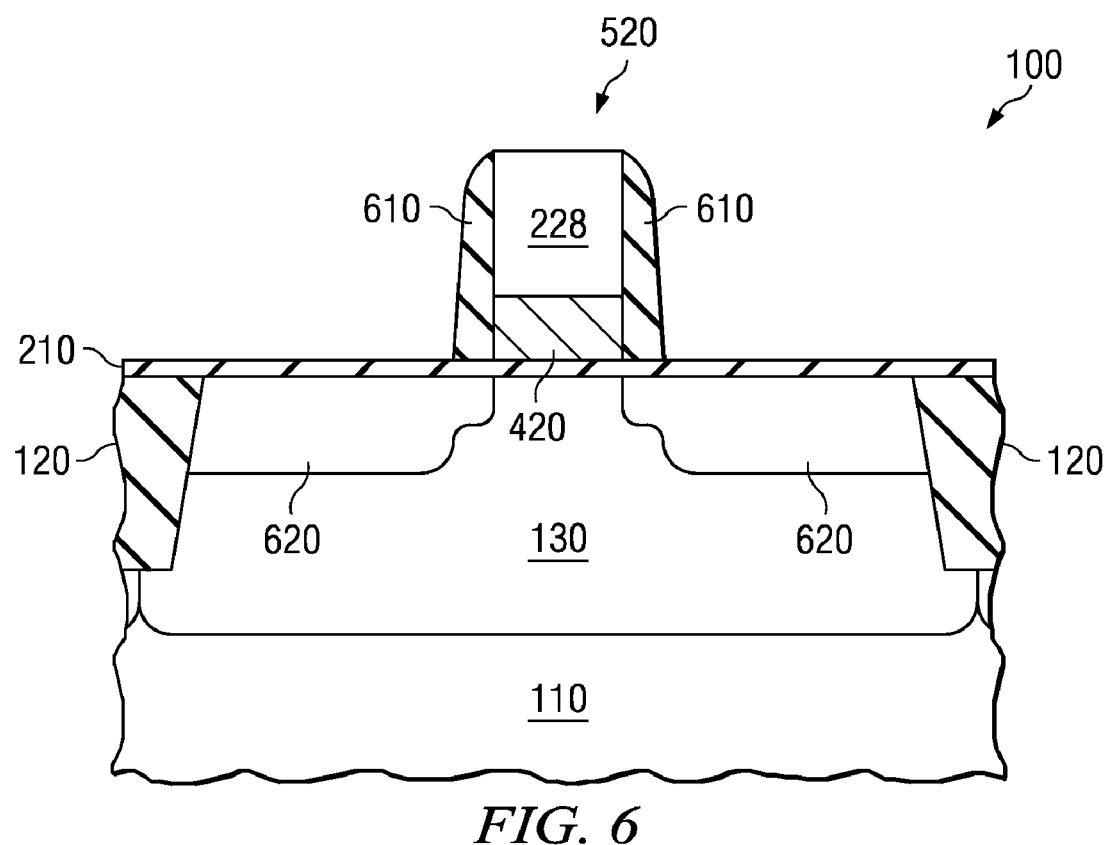
FIG. 6 illustrates a cross-sectional view of the partially completed semiconductor device illustrated in FIG. 5 after forming a number of different conventional features thereon and completing the manufacture therefore.

Turning now to FIG. 6, illustrated is a cross-sectional view of the partially completed semiconductor device 100 illustrated in FIG. 5 after forming a number of different conventional features thereon and completing the manufacture therefore. The partially completed semiconductor device 100 illustrated in FIG. 6 additionally includes gate sidewall spacers 610 and source/drain regions 620, among other elements. As these, as well as all the remaining processing steps to complete the semiconductor device are conventional, no further detail is warranted.

Figure 7:
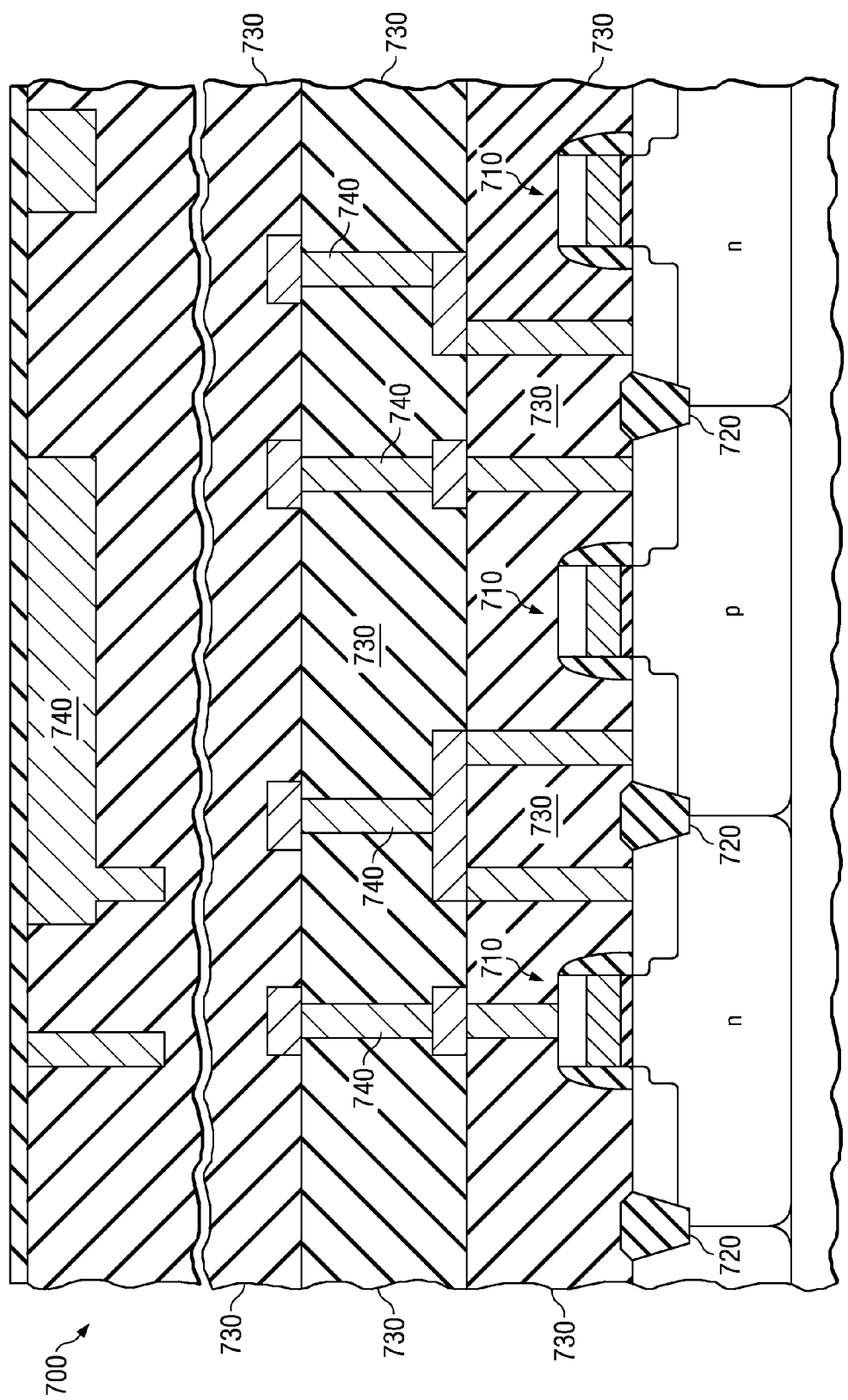
FIG. 7 illustrates a cross-sectional view of an integrated circuit (IC) incorporating devices manufactured in accordance with the principles of the present invention.

Referring finally to FIG. 7, illustrated is a cross-sectional view of an integrated circuit (IC) 700 incorporating devices manufactured in accordance with the principles of the present invention. The IC 700 may include devices, such as transistors used to form CMOS devices, BiCMOS devices, Bipolar devices, or other types of devices. The IC 700 may further include passive devices, such as inductors or resistors, or it may also include optical devices or optoelectronic devices. Those skilled in the art are familiar with these various types of devices and their manufacture.

In the particular embodiment illustrated in FIG. 7, the IC 700 includes transistor devices 710 located between isolation structures 720. The IC 700 of FIG. 7 further includes dielectric layers 730 located over the transistor devices 710. In accordance with the principles of the present invention, interconnects 740 are located within the dielectric layers 730. The devices of the IC 700, as those skilled in the art are aware, may be manufactured using the method for pattering a metal gate electrode discussed above with respect to FIGS. 1-6.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising the steps of:

forming a gate dielectric layer over a substrate;

forming a first gate electrode layer over said gate dielectric layer;

forming a second gate electrode layer over said first gate electrode layer;

etching said second gate electrode layer using a dry etch process;

continuing said dry etch process with no intervening steps to etch into said first gate electrode layer and stopping said dry etch process prior to reaching the gate dielectric layer thereby leaving a remaining first gate electrode layer; and etching said remaining first gate electrode layer down to the gate dielectric layer using a wet etch process.

2. The method as recited in claim 1 wherein an exposed surface of the remaining first gate electrode layer is a modified surface, wherein the modified surface allows the second wet etch process to easily etch the remaining first gate electrode layer down to the gate dielectric layer.

3. The method as recited in claim 1 wherein the dry etch process is an anisotropic etch process.

4. The method as recited in claim 1 wherein the dry etch process is a biased plasma etch process.

5. The method as recited in claim 1 wherein the wet etch process is highly selective to the gate dielectric layer.

6. The method as recited in claim 1 wherein the first gate electrode layer comprises titanium nitride and the gate dielectric layer comprises a gate oxide layer, and wherein the dry etch process includes an anisotropic etch and the wet etch process includes a solution of ammonium hydroxide, hydrogen peroxide and water.

7. The method as recited in claim 1 wherein the first gate electrode layer comprises titanium nitride and the gate dielectric layer comprises a gate oxide layer, and wherein the dry etch process includes an anisotropic etch and the wet etch process includes a solution of about 30% hydrogen peroxide.

8. A method for patterning a metal gate electrode, comprising:

forming a metal gate electrode layer over a gate dielectric layer located on a substrate, said metal gate electrode layer comprising a metal layer and a polysilicon layer; and etching the metal layer of the metal gate electrode layer using a combination of a dry etch process and a wet etch process, wherein etching the metal layer using a combination of a dry etch process and a wet etch process includes etching the metal gate electrode layer using a first dry etch process and a second subsequent wet etch process and wherein the first dry etch process etches the polysilicon layer, continues with no intervening steps to etch a portion of the metal layer, and stops before reaching the gate dielectric layer thereby leaving a remaining gate electrode layer, and the wet etch process etches the remaining gate electrode layer down to the gate dielectric layer.

* * * * *